United States Patent
Kyono et al.

(10) Patent No.: US 8,718,110 B2
(45) Date of Patent: May 6, 2014

(54) NITRIDE SEMICONDUCTOR LASER AND EPITAXIAL SUBSTRATE

(75) Inventors: Takashi Kyono, Itami (JP); Yohei Enya, Itami (JP); Takamichi Sumitomo, Itami (JP); Yusuke Yoshizumi, Itami (JP); Masaki Ueno, Itami (JP); Katsunori Yanashima, Kanagawa (JP); Kunihiko Tasai, Tokyo (JP); Hiroshi Nakajima, Kanagawa (JP)

(73) Assignees: Sumitomo Electric Industries, Ltd., Osaka-Shi (JP); Sony Corporation, Tokyo (JP)

( * ) Notice: Subject to any disclaimer, the term of this patent is extended or adjusted under 35 U.S.C. 154(b) by 99 days.

(21) Appl. No.: 13/366,636

(22) Filed: Feb. 6, 2012

(65) Prior Publication Data

US 2012/0269222 A1    Oct. 25, 2012

(30) Foreign Application Priority Data

Apr. 22, 2011    (JP) ................. P2011-096443

(51) Int. Cl.
*H01S 5/00*    (2006.01)

(52) U.S. Cl.
USPC ............... 372/45.011; 372/43.01; 372/45.01; 372/46.01

(58) Field of Classification Search
USPC ................. 372/43.01, 45.01, 45.011
See application file for complete search history.

(56) References Cited

U.S. PATENT DOCUMENTS

| | | | | |
|---|---|---|---|---|
| 2007/0195848 | A1* | 8/2007 | Matsumura et al. | 372/46.01 |
| 2012/0008660 | A1* | 1/2012 | Fujii et al. | 372/45.01 |
| 2012/0258557 | A1* | 10/2012 | Yoshizumi et al. | 438/33 |

FOREIGN PATENT DOCUMENTS

| | | |
|---|---|---|
| JP | 08-195529 | 7/1996 |
| JP | 10-173227 | 6/1998 |
| JP | 2000-299532 | 10/2000 |
| JP | 2005-039107 | 2/2005 |
| JP | 2006-229008 | 8/2006 |
| JP | 2010-087264 | 4/2010 |
| JP | 2010-129676 | 6/2010 |
| JP | 2010-192865 | 9/2010 |
| JP | 2011-023539 | 2/2011 |

OTHER PUBLICATIONS

International Preliminary Report on Patentability issued in PCT International Application No. PCT/JP2012/052711 dated Oct. 31, 2013.

* cited by examiner

*Primary Examiner* — Dung Nguyen
(74) *Attorney, Agent, or Firm* — Venable LLP; Michael A. Sartori

(57) ABSTRACT

A nitride semiconductor laser includes an electrically conductive support substrate with a primary surface of a gallium nitride based semiconductor, an active layer provided above the primary surface, and a p-type cladding region provided above the primary surface. The primary surface is inclined relative to a reference plane perpendicular to a reference axis extending in a direction of the c-axis of the gallium nitride based semiconductor. The p-type cladding region includes first and second p-type Group III nitride semiconductor layers. The first p-type semiconductor layer comprises an InAlGaN layer including built-in anisotropic strain. The second p-type semiconductor layer comprises semiconductor different from material of the InAlGaN layer. The first nitride semiconductor layer is provided between the second p-type semiconductor layer and the active layer. The second p-type semiconductor layer has a resistivity lower than that of the first p-type semiconductor layer.

21 Claims, 9 Drawing Sheets

| p-TYPE CLADDING REGION | STRAIN PRESENT/ABSENT | RESISTIVITY |
|---|---|---|
| NITRIDE SEMICONDUCTOR LAYER 29 |  | LOW |
| NITRIDE SEMICONDUCTOR LAYER 27 | PRESENT | HIGH |

(b)

| p-TYPE CLADDING REGION | STRAIN PRESENT/ABSENT | RESISTIVITY | Eg |
|---|---|---|---|
| NITRIDE SEMICONDUCTOR LAYER 29 |  | LOW | SMALL |
| NITRIDE SEMICONDUCTOR LAYER 27 | PRESENT | HIGH | LARGE |

(c)

| p-TYPE CLADDING REGION | STRAIN PRESENT/ABSENT | RESISTIVITY | Eg | Mg CONCENTRATION |
|---|---|---|---|---|
| NITRIDE SEMICONDUCTOR LAYER 29 |  | LOW | SMALL | HIGH |
| NITRIDE SEMICONDUCTOR LAYER 27 | PRESENT | HIGH | LARGE | LOW |

Fig.3
(a)
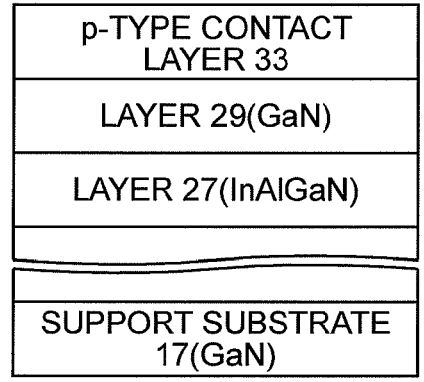
(b)
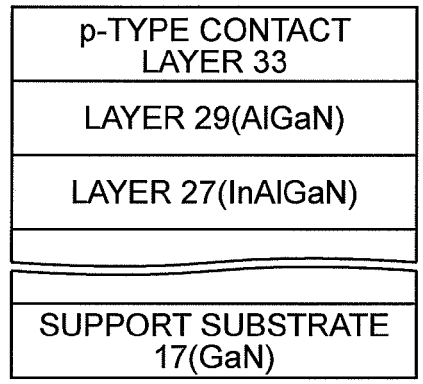
(c)
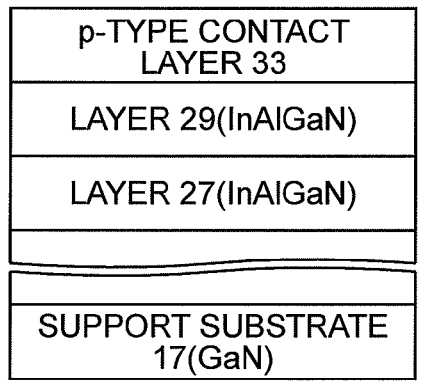

| p-GaN 50nm | p-GaN 200nm | p-In₀.₀₃Al₀.₁₄Ga₀.₈₃N 200nm | p-Al₀.₁₂Ga₀.₈₈N 20nm | In₀.₀₄Ga₀.₉₆N 200nm | In₀.₀₄Ga₀.₉₆N 200nm | n-TYPE CLADDING REGION | n-TYPE BUFFER LAYER | SUBSTRATE |

(b)

| p-GaN 50nm | p-GaN 200nm | p-In₀.₀₃Al₀.₁₄Ga₀.₈₃N 200nm | p-Al₀.₁₂Ga₀.₈₈N 20nm | In₀.₀₂Ga₀.₉₈N 200nm | In₀.₀₄Ga₀.₉₆N 200nm | n-TYPE CLADDING REGION | n-TYPE BUFFER LAYER | SUBSTRATE |

(c)

| p-GaN 50nm | p-GaN 200nm | p-In₀.₀₃Al₀.₁₄Ga₀.₈₃N 200nm | p-Al₀.₁₂Ga₀.₈₈N 20nm | In₀.₀₃Ga₀.₉₇N 150nm | In₀.₀₃Ga₀.₉₇N 250nm | n-TYPE CLADDING REGION | n-TYPE BUFFER LAYER | SUBSTRATE |

Fig.9
(a)
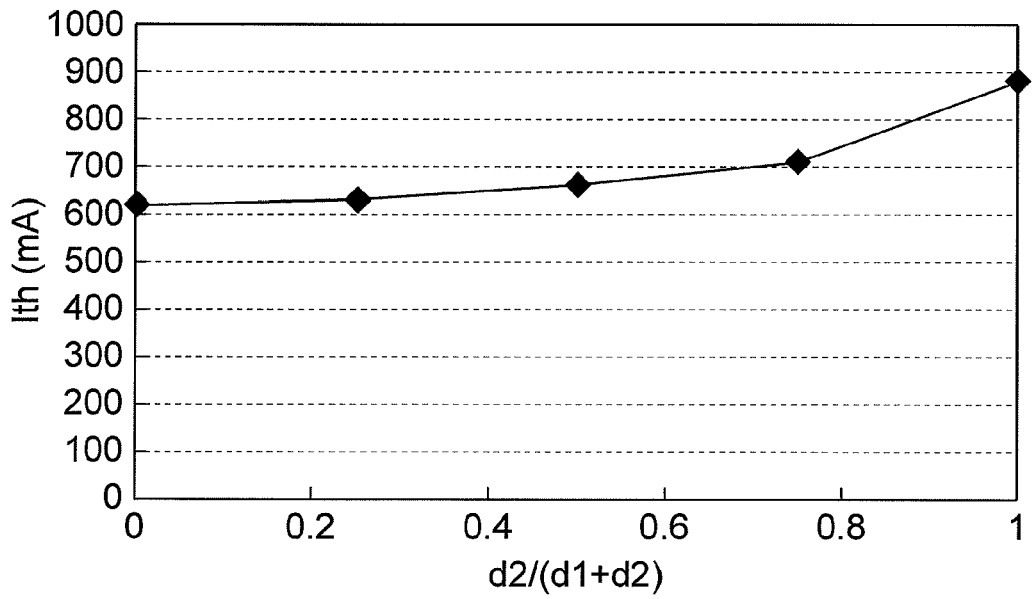
(b)
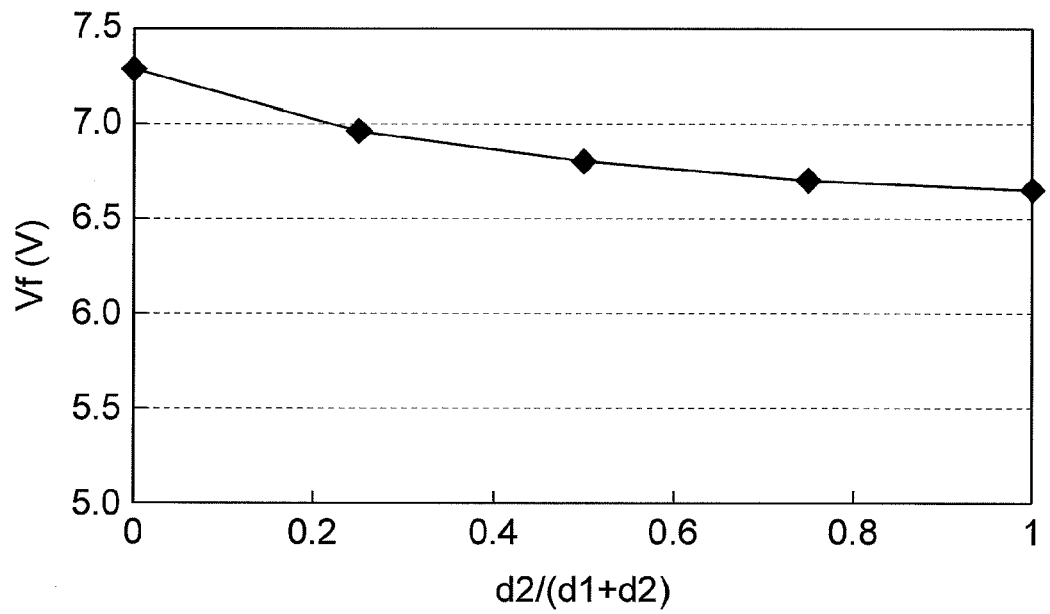

NITRIDE SEMICONDUCTOR LASER AND EPITAXIAL SUBSTRATE

BACKGROUND OF THE INVENTION

1. Field of the Invention

The present invention relates to a nitride semiconductor laser and an epitaxial substrate for the nitride semiconductor laser.

2. Related Background Art

Patent Literature 1 discloses a nitride semiconductor laser device. The nitride semiconductor laser device is improved in crystallinity of guiding layers, an active layer, etc. and is configured to emit laser light of a long-wavelength. Patent Literature 2 discloses an oxide semiconductor laser device. This oxide semiconductor laser device has device characteristics of narrow emission angle and low lasing threshold current, and also has an excellent stability of a propagation mode.

Patent Literature 1: Japanese Patent Application Laid-open No. 2000-299532

Patent Literature 2: Japanese Patent Application Laid-open No. 2005-39107

SUMMARY OF THE INVENTION

In Patent Literature 1, a p-type cladding layer composes a first nitride semiconductor having $Al_aGa_{1-a}N$ (0≤a<1), and an Al composition of this $Al_aGa_{1-a}N$ has a compositionally-graded profile to decrease toward the active layer. The active layer has a quantum well structure containing $In_bGa_{1-b}N$ (0≤b<1), and a p-type guide layer has a compositionally-graded profile to increase a composition of In toward the active layer. Accordingly, the refractive index of the p-type guiding layer increases toward the active layer and, as a result, light spreads from the active layer to the cladding layer. Furthermore, the refractive index of the p-type cladding layer also increases toward the active layer and propagating light exudes to the cladding layer.

In Patent Literature 2, an n-type cladding layer and a non-doped quantum well active layer are provided on an n-type ZnO single-crystal substrate. The n-type cladding layer is composed of two layers, an n-type $Mg_{0.08}Zn_{0.92}O$ first cladding layer of 1 μm thickness and an n-type $Mg_{0.1}Zn_{0.9}O$ second cladding layer (low refractive index) of 0.1 μm thickness. The second cladding layer with the low refractive index is closer to the nondoped quantum well active layer than the first cladding layer. In this oxide semiconductor laser device, the guided mode is stabilized. However, Patent Literature 2 relates to the laser device of the semiconductor different from Group III nitrides and describes nothing about improvement in electrical characteristics. The refractive index of the MgZnO layer closer to the active layer is smaller than that of the MgZnO layer farther from the active layer.

It is an object of the present invention to provide a nitride semiconductor laser enabling reduction of drive voltage while reducing degradation of optical confinement. It is another object of the present invention to provide an epitaxial substrate for this nitride semiconductor laser.

A nitride semiconductor laser according to one aspect of the present invention comprises: (a) an electrically conductive support substrate with a primary surface comprised of a gallium nitride based semiconductor; (b) an active layer provided above the primary surface; and (c) a p-type cladding region provided above the primary surface. The primary surface of the support substrate is inclined with respect to a reference plane perpendicular to the reference axis that extends in a direction of the c-axis of the gallium nitride based semiconductor; the active layer is provided between the support substrate and the p-type cladding region; the p-type cladding region includes a first p-type Group III nitride semiconductor layer and a second p-type Group III nitride semiconductor layer; the first p-type Group III nitride semiconductor layer is made of an InAlGaN layer; the second p-type Group III nitride semiconductor layer is made of a semiconductor different from a material of the InAlGaN layer; the InAlGaN layer includes built-in anisotropic strain; the first p-type Group III nitride semiconductor layer is provided between the second p-type Group III nitride semiconductor layer and the active layer; and a resistivity of the second p-type Group III nitride semiconductor layer is lower than a resistivity of the first p-type Group III nitride semiconductor layer.

In this nitride semiconductor laser, the p-type cladding region includes the first and second p-type Group III nitride semiconductor layers of the materials different from each other and therefore the p-type cladding region has excellent optical confinement, without employing the compositionally-graded profile for each of the first and second p-type Group III nitride semiconductor layers. Furthermore, this first p-type Group III nitride semiconductor layer is provided between the second p-type Group III nitride semiconductor layer and the active layer. Holes move through the second p-type Group III nitride semiconductor layer having the resistivity lower than that of the first p-type Group III nitride semiconductor layer and thereafter reach the first p-type Group III nitride semiconductor layer.

Since the InAlGaN layer of the first p-type Group III nitride semiconductor layer includes built-in anisotropic strain, holes in this InAlGaN layer have a smaller effective mass than those in InAlGaN grown on a c-plane. For this reason, while the resistivity of the InAlGaN layer of the first p-type Group III nitride semiconductor layer is higher than that of the second p-type Group III nitride semiconductor layer, the holes with the smaller effective mass assumes a role in conduction in the InAlGaN layer. Therefore, when holes from the second p-type Group III nitride semiconductor layer reach the first p-type Group III nitride semiconductor layer to move therein, dynamic electrical resistance in the InAlGaN layer becomes larger than a value expected from the intrinsic resistivity of the first p-type Group III nitride semiconductor layer, so that the forward drive voltage decreases.

An epitaxial substrate for a nitride semiconductor laser according to another aspect of the present invention comprises: (a) an electrically conductive substrate with a primary surface comprised of a gallium nitride based semiconductor; (b) an active layer provided above the primary surface; and (c) a p-type cladding region provided above the primary surface. The primary surface is inclined with respect to a reference plane perpendicular to the reference axis that extends in a direction of the c-axis of the gallium nitride based semiconductor; the active layer is provided between the substrate and the p-type cladding region; the p-type cladding region includes a first p-type Group III nitride semiconductor layer and a second p-type Group III nitride semiconductor layer; the first p-type Group III nitride semiconductor layer is made of an InAlGaN layer; the second p-type Group III nitride semiconductor layer is made of a semiconductor different from a material of the InAlGaN layer; the InAlGaN layer includes built-in anisotropic strain; the first p-type Group III nitride semiconductor layer is provided between the second p-type Group III nitride semiconductor layer and the active layer; and a resistivity of the second p-type Group III nitride semiconductor layer is lower than a resistivity of the first p-type Group III nitride semiconductor layer.

In this epitaxial substrate, the p-type cladding region includes the first and second p-type Group III nitride semiconductor layers of the materials different from each other and thus each of the first and second p-type Group III nitride semiconductor layers includes no compositionally-graded profile; therefore, the p-type cladding region is provided with an excellent optical confinement. This first p-type Group III nitride semiconductor layer is provided between the second p-type Group III nitride semiconductor layer and the active layer. Holes in the p-type cladding region move through the second p-type Group III nitride semiconductor layer with the resistivity smaller than that of the first p-type Group III nitride semiconductor layer, and thereafter reach the first p-type Group III nitride semiconductor layer.

Since the InAlGaN layer of the first p-type Group III nitride semiconductor layer includes built-in anisotropic strain, holes in this InAlGaN layer has a smaller effective mass than those in InAlGaN grown on a c-plane. For this reason, while the resistivity of the InAlGaN layer of the first p-type Group III nitride semiconductor layer is higher than that of the second p-type Group III nitride semiconductor layer, holes with the smaller effective mass assume a role in conduction in the InAlGaN layer. Therefore, when the holes from the second p-type Group III nitride semiconductor layer reach the first p-type Group III nitride semiconductor layer to move therein, dynamic electrical resistance in the InAlGaN layer becomes larger than a value expected from the intrinsic resistivity of the first p-type Group III nitride semiconductor layer, so that it becomes feasible to reduce the forward drive voltage of the nitride semiconductor laser using this epitaxial substrate.

In the aforementioned aspects of the present invention, preferably, a bandgap energy of the first p-type Group III nitride semiconductor layer is larger than a bandgap energy of the second p-type Group III nitride semiconductor layer. The foregoing aspects ensure excellent optical confinement in the p-side region.

In the invention according to the aforementioned aspects of the present invention, preferably, a bandgap of the first p-type Group III nitride semiconductor layer is not less than 3.47 eV and not more than 3.63 eV. According to the foregoing aspects, the first p-type Group III nitride semiconductor layer is closer to the active layer than the second p-type Group III nitride semiconductor layer and the foregoing bandgap value allows the GaN-based light emitting device to ensure excellent optical confinement.

In the invention according to the aforementioned aspects of the present invention, preferably, a thickness of the p-type cladding region is not less than 300 nm and not more than 1000 nm, the first and second p-type Group III nitride semiconductor layers have respective thicknesses d1 and d2, and the thickness d2 of the second p-type Group III nitride semiconductor layer satisfies the condition of $0.2 \leq d2/(d1+d2) \leq 0.6$.

According to the foregoing aspects, when the thickness of the second p-type Group III nitride semiconductor layer has a value in the foregoing range, the second p-type Group III nitride semiconductor layer, together with the first p-type Group III nitride semiconductor layer having the remaining thickness, can provide excellent optical confinement and a low drive voltage. For example, the second p-type Group III nitride semiconductor layer with the thickness in the foregoing range serves to reduce the drive voltage by its low resistivity, and the first p-type Group III nitride semiconductor layer with the remaining thickness of the foregoing range serves to reduce the drive voltage by its low effective mass. The first and second p-type Group III nitride semiconductor layers having the respective thicknesses in the foregoing range are thicker than the thickness of the contact layer necessary for excellent contact with an electrode.

In the invention according to the aforementioned aspects of the present invention, preferably, the first and second p-type Group III nitride semiconductor layers are doped with magnesium (Mg), and a magnesium concentration of the first p-type Group III nitride semiconductor layer is smaller than a magnesium concentration of the second p-type Group III nitride semiconductor layer.

According to the foregoing aspects, the magnesium concentration of the first p-type Group III nitride semiconductor layer closer to the active layer is smaller than that of the second p-type Group III nitride semiconductor layer, and it is thus feasible to suppress increase of absorption loss due to optical absorption of the dopant and reduction of mobility due to ion scattering of the dopant.

In the invention according to the aforementioned aspects of the present invention, the magnesium concentration of the first p-type Group III nitride semiconductor layer can be not less than $8 \times 10^{17}$ cm$^{-3}$. The magnesium concentration in this range can lower the resistivity of the first p-type Group III nitride semiconductor layer. Furthermore, the magnesium concentration of the first p-type Group III nitride semiconductor layer can be not more than $2 \times 10^{19}$ cm$^{-3}$. When the magnesium concentration exceeds this range, the absorption loss due to optical absorption of the dopant causes prominent influence on increase of threshold current. Furthermore, the reduction of mobility due to ion scattering of the dopant becomes prominent.

In the invention according to the foregoing aspects of the present invention, preferably, an angle which the primary surface of the support substrate forms with the reference axis is in the range of not less than 10 degrees and not more than 80 degrees or in the range of not less than 100 degrees and not more than 170 degrees. According to this aspects, when the inclination of the primary surface of the support substrate or the substrate is in the above angle range, the effective mass of hole is made sufficiently small, so as to effectively exhibit the effect of the p-type cladding region including the first and second p-type Group III nitride semiconductor layers.

In the invention according to the aforementioned aspects of the present invention, preferably, an angle between the reference axis and the primary surface of the support substrate is in the range of not less than 63 degrees and not more than 80 degrees or in the range of not less than 100 degrees and not more than 117 degrees. In this case, the c-axis of the gallium nitride based semiconductor is preferably inclined away from the c-axis toward the m-axis of the gallium nitride based semiconductor. According to the foregoing aspects, when the inclination of the primary surface of the support substrate or substrate is in this angle range, the underlying semipolar surface for growth of the InAlGaN layer has excellent indium incorporation in growth of the InAlGaN layer. Thanks to the excellent In incorporation, InAlGaN can be grown with excellent crystallinity and it becomes easier to provide the InAlGaN layer with excellent electrical conduction for the double-layered cladding region.

The invention according to the aforementioned aspects of the present invention can further comprise a p-type contact region provided so as to make a junction with the p-type cladding region as well as an electrode provided so as to make a junction with the p-type contact region. The thickness of the p-type contact region can be less than 300 nm, and a bandgap energy of the p-type cladding region can be not less than that of the p-type contact region. According to the foregoing aspects, holes are supplied from the p-type contact region, which has the smaller bandgap energy and low activation energy of acceptor, into the second p-type Group III nitride semiconductor layer with the low resistivity, resulting in reduction of the drive voltage.

The invention according to the aforementioned aspects of the present invention can further comprise a p-type contact region provided so as to make a junction with the p-type cladding region, and an electrode provided so as to make a junction with the p-type contact region. The thickness of the p-type contact region can be less than 300 nm, and a p-type dopant concentration of the p-type cladding region can be lower than that of the p-type contact region. According to the foregoing aspects, holes are supplied from the p-type contact region into the second p-type Group III nitride semiconductor layer with the low resistivity, so as to serve to reduce the drive voltage. Furthermore, the contact resistance of the electrode can be decreased.

In the invention according to the aforementioned aspects of the present invention, preferably, the second p-type Group III nitride semiconductor layer is either one of an InAlGaN layer including built-in strain and an AlGaN layer including built-in strain.

According to the foregoing aspects, when the second p-type Group III nitride semiconductor layer includes the AlGaN layer, this AlGaN layer makes a junction with the InAlGaN layer and incorporates anisotropic strain. This strain can decrease the effective mass of hole in the AlGaN layer of the second p-type Group III nitride semiconductor layer. Hence, it becomes easier that holes flow into the first p-type Group III nitride semiconductor layer.

According to the foregoing aspects, when the second p-type Group III nitride semiconductor layer includes the InAlGaN layer, this InAlGaN layer makes a junction with the underlying InAlGaN layer and incorporates built-in anisotropic strain. This strain can decrease the effective mass of hole in the InAlGaN layer of the second p-type Group III nitride semiconductor layer. Furthermore, the second p-type Group III nitride semiconductor layer can be provided with a desired bandgap, independently of lattice matching restriction between the first and second p-type Group III nitride semiconductor layers.

In the invention according to the aforementioned aspects of the present invention, the second p-type Group III nitride semiconductor layer can be made of a GaN layer. According to the foregoing aspects, it is feasible to achieve technical contributions based on the low resistivity by GaN and the small effective mass by the InAlGaN layer.

In the invention according to the aforementioned aspects of the present invention, preferably, the active layer is provided so as to emit light at the wavelength of not less than 480 nm and not more than 550 nm. According to the foregoing aspects, it is feasible to provide excellent optical confinement and a low drive voltage in the foregoing wavelength range.

In the invention according to the aforementioned aspects of the present invention, preferably, the c-axis is inclined away from the c-axis toward the m-axis of the gallium nitride based semiconductor, and the active layer includes an InGaN layer. According to the foregoing aspects, an interband transition enabling lasing with a low threshold is activated in emission of light in the active layer.

The invention according to the aforementioned aspects of the present invention can further comprise an n-side InGaN optical guiding layer provided between the active layer and the support substrate; and a p-side InGaN optical guiding layer provided between the active layer and the p-type cladding layer. A thickness of the n-side InGaN optical guiding layer is preferably larger than a thickness of the p-side InGaN optical guiding layer.

According to the foregoing aspects, since the thickness of the n-side InGaN optical guiding layer is larger than that of the p-side InGaN optical guiding layer, a peak of electric field profile of light propagating in an optical waveguide including the active layer is shifted to the n-type region, and this light emitting device can be provided with excellent optical confinement as a whole of the optical waveguide even if the refractive index of the p-type cladding region is slightly higher than a value desired for optical confinement in order to achieve a low drive voltage.

The invention according to the aforementioned aspects of the present invention can further comprise an n-side InGaN optical guiding layer provided between the active layer and the support substrate; and a p-side InGaN optical guiding layer provided between the active layer and the p-type cladding layer. An indium composition of the n-side InGaN optical guiding layer is preferably larger than an indium composition of the p-side InGaN optical guiding layer.

According to the foregoing aspects, the indium composition of the n-side InGaN optical guiding layer is larger than that of the p-side InGaN optical guiding layer, and therefore the peak of electric field profile of light propagating in the optical waveguide including the active layer is shifted to the n-type region, and the light emitting device can be provided with excellent optical confinement as a whole of the optical waveguide even if the refractive index of the p-type cladding region is slightly higher than a value desired for optical confinement in order to achieve a low drive voltage.

The invention according to the aforementioned aspects of the present invention can further comprise: an n-side InGaN optical guiding layer provided between the active layer and the support substrate; and a p-side InGaN optical guiding layer provided between the active layer and the p-type cladding layer. An indium composition of the n-side InGaN optical guiding layer is preferably not less than 0.04.

According to the foregoing aspects, since the indium compositions of the n-side and p-side InGaN optical guiding layers both are not less than 0.04, the refractive indices of these InGaN optical guiding layers can be made higher, so that the light emitting device can be provided with excellent optical confinement as a whole of the optical waveguide.

The invention according to the aforementioned aspects of the present invention can further comprise: an n-side InGaN optical guiding layer provided between the active layer and the support substrate; and a p-side InGaN optical guiding layer provided between the active layer and the p-type cladding region. A product of a thickness of the n-side InGaN optical guiding layer and an indium composition of the n-side InGaN optical guiding layer is larger than a product of a thickness of the p-side InGaN optical guiding layer and an indium composition of the p-side InGaN optical guiding layer, and the product of the thickness of the n-side InGaN optical guiding layer and the indium composition of the a-side InGaN optical guiding layer is not less than 2 and not more than 10, where the unit of the thickness of the n-side InGaN optical guiding layer is represented in nanometers and the indium composition of the n-side InGaN optical guiding layer is represented in a molar ratio to the Group III constituent element.

According to the foregoing aspects, since the product of the thickness and indium composition of the n-side InGaN optical guiding layer is larger than the product of the thickness and indium composition of the p-side InGaN optical guiding layer, the peak of electric field profile of light propagating in the optical waveguide including the active layer is shifted to the n-type region and the light emitting device can be provided with excellent optical confinement as a whole of the optical waveguide even if the refractive index of the p-type cladding region is slightly higher than a value desired for optical confinement in order to achieve a low drive voltage.

In the invention according to the aforementioned aspects of the present invention, the support substrate is a GaN substrate, a lattice constant D1(GaN) of the c-axis of the GaN substrate has a component D1(GaN)p parallel to the primary surface of the support substrate and a component D1(GaN)n perpendicular to the primary surface of the support substrate, a lattice constant D1(InAlGaN) of the c-axis of the InAlGaN layer has a component D1(InAlGaN)$_p$ parallel to the primary surface of the support substrate and a component D1(InAlGaN)n perpendicular to the primary surface of the support substrate, a lattice mismatch degree R1p in the InAlGaN layer is defined by (D1(InAlGaN)p−D1(GaN)p)/D1(GaN)p, and the lattice mismatch degree R1p is not less than −0.15% and not more than +0.2%.

According to the foregoing aspects, no misfit dislocations are introduced into the first p-type Group III nitride semiconductor layer having the large bandgap. The foregoing aspects is intended for lattice matching of the lattice constant associated with the c-axis out of the two crystal axes related to the lattice matching and the other axis (a-axis or m-axis) is strained. The aforementioned effective mass reduction effect is exhibited by this anisotropic strain.

In the invention according to the aforementioned aspect of the present invention, the support substrate is a GaN substrate; the c-axis is inclined toward a crystal axis which is either one of the a-axis and the m-axis of the gallium nitride based semiconductor; a lattice constant D1(GaN) of the c-axis of the GaN substrate has a component D1(GaN)p parallel to the primary surface of the support substrate and a component D1(GaN)n perpendicular to the primary surface of the support substrate; a lattice constant D1(InAlGaN) of the c-axis of the InAlGaN layer has a component D1(InAlGaN)p parallel to the primary surface of the support substrate and a component D1(InAlGaN)n perpendicular to the primary surface of the support substrate; a lattice mismatch degree R1p in the InAlGaN layer is defined by (D1(InAlGaN)p−D1(GaN)p)/D1(GaN)p; the lattice mismatch degree R1p is not less than −0.15% and not more than 0%; a lattice mismatch degree R2p in the InAlGaN layer as to the other crystal axis of the a-axis and the m-axis is defined by (D2(InAlGaN)p−D2(GaN)p)/D2(GaN)p; the lattice mismatch degree R2p satisfies the condition of not less than 0% and not more than 0.2%; the component D2(InAlGaN)p is perpendicular to the component D1(InAlGaN)p; and the component D2(GaN)p is perpendicular to the component D1(GaN)p.

According to the foregoing aspects, lattice matching is not achieved for either one crystal axis out of the two crystal axes associated with the lattice matching. Namely, the two crystal axes both are strained in a certain small amount. If lattice matching is achieved for one of the crystal axes in InAlGaN with a large bandgap, the lattice mismatch degree of the other axis becomes larger, which can cause relaxation of InAlGaN of the first p-type Group III nitride semiconductor layer. When such InAlGaN is used, neither of the crystal axes is lattice-matched, but providing InAlGaN with a composition of a low lattice mismatch degree is effective for avoidance of relaxation. The strains about the two axes can develop aforementioned effective mass reduction.

BRIEF DESCRIPTION OF THE DRAWINGS

The foregoing objects and the other objects, features, and advantages of the present invention can more readily become clear from the following detailed description of the preferred embodiments of the present invention proceeding with reference to the accompanying drawings.

FIG. 2 is a drawing showing relations among resistivities, bandgaps Eg, and p-type dopant concentrations in a p-type cladding region.

FIG. 3 is a drawing showing possible structures of first and second p-type Group III nitride semiconductor layers in the p-type cladding region.

FIG. 8 is a drawing schematically showing structures of Group III nitride semiconductor lasers fabricated in Example 3.

FIG. 9 is a drawing showing characteristics of Group III nitride semiconductor lasers fabricated in Example 4.

DETAILED DESCRIPTION OF THE PREFERRED EMBODIMENTS

The expertise of the present invention can be readily understood in view of the following detailed description with reference to the accompanying drawings provided by way of illustration only. The below will describe embodiments of the present invention concerning nitride semiconductor lasers, epitaxial substrates, and methods for manufacturing the nitride semiconductor lasers and epitaxial substrates. The same portions will be denoted by the same reference signs as much as possible.

Figure 1:
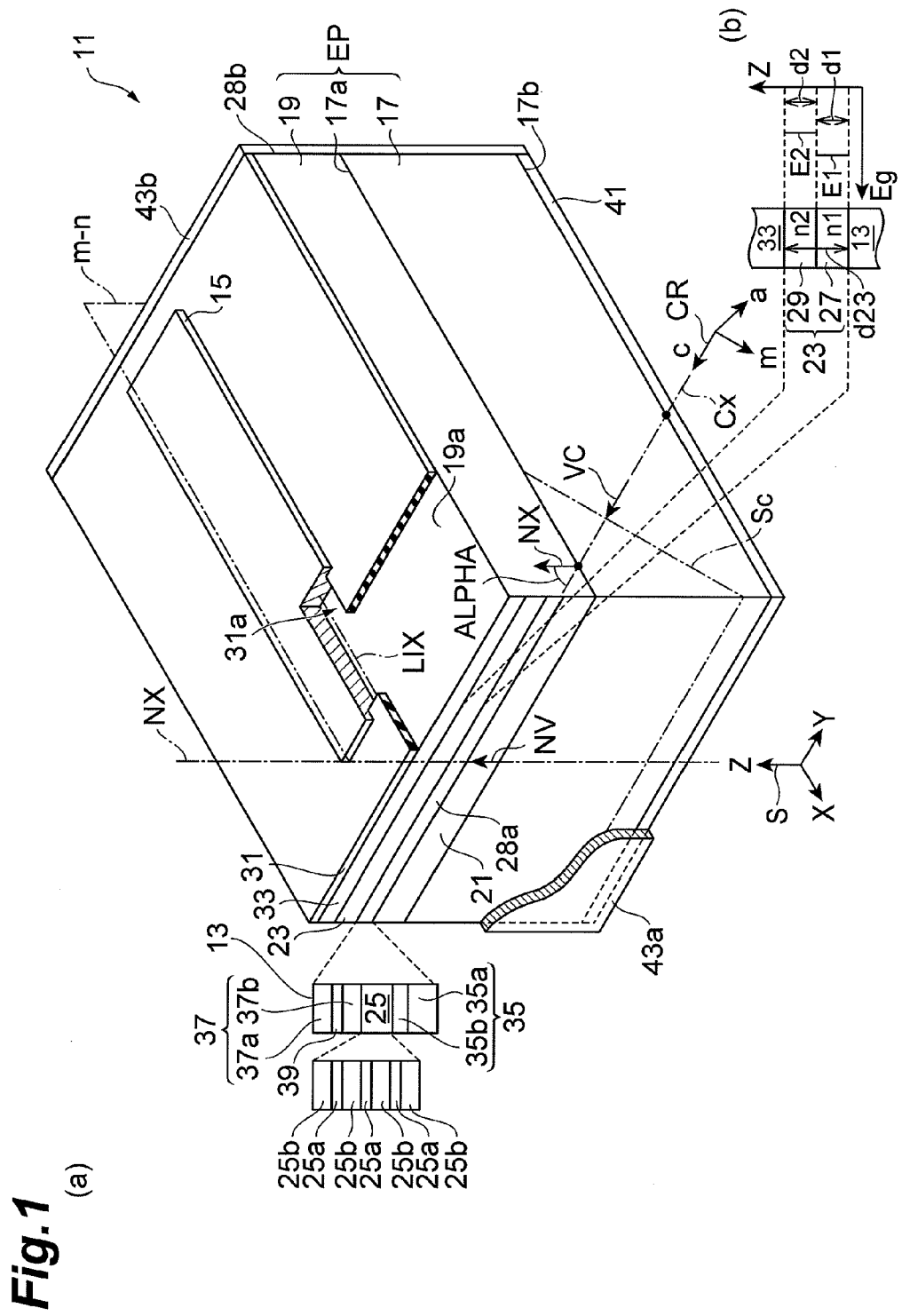
FIG. 1 is a drawing schematically showing a structure of a Group III nitride semiconductor laser according to an embodiment of the present invention.

FIG. 1 is a drawing schematically showing a structure of a Group III nitride semiconductor laser according to an embodiment of the present invention. The Group III nitride semiconductor laser 11 has a gain-guiding type structure, but embodiments of the present invention are not limited to the gain-guiding type structure; for example, a ridge structure can also be applied thereto. The Group III nitride semiconductor laser 11 includes a support substrate 17 and a semiconductor region 19. An epitaxial substrate EP for the Group III nitride semiconductor laser 11 includes a substrate instead of the support substrate 17 and has a semiconductor lamination instead of the semiconductor region 19. A layer structure of this semiconductor lamination is the same as that of the semiconductor region 19. The epitaxial substrate EP includes no electrode.

The following will describe the Group III nitride semiconductor laser 11, but this description is also applied to the epitaxial substrate EP for the Group III nitride semiconductor laser 11. The support substrate 17 has electrical conductivity, and this electrical conductivity is, for example, a value necessary for flow of electric current to the semiconductor laser 11. The support substrate 17 has a primary surface 17a and a back surface 17b. The primary surface 17a comprises a gallium nitride based semiconductor, e.g., hexagonal GaN. In a preferred example, the support substrate 17 comprises a hexagonal Group III nitride semiconductor and can be comprised of a gallium nitride based semiconductor. The primary surface 17a is inclined relative to a reference plane (e.g., a typical c-plane Sc) perpendicular to the reference axis that extends in the c-axis direction of the gallium nitride based semiconductor (direction of c-axis vector VC). The primary surface 17a has a semipolar nature. The semiconductor region 19 is provided on the primary surface 17a of the support substrate 17.

The semiconductor region 19 includes a light emitting layer 13, a first cladding region 21, and a second cladding region 23. The light emitting layer 13 can include an active layer 25, and the active layer 25 is provided above the primary surface 17a. The first cladding region (n-type cladding region) 21 and the second cladding region (p-type cladding region) 23 are provided on the primary surface 17a. The active layer 25 is provided between the support substrate 17 and the second cladding region 23. The first cladding region 21 comprises a gallium nitride based semiconductor layer or plural gallium nitride based semiconductor layers, e.g., n-type GaN, n-type AlGaN, n-type InAlGaN, or the like. The second cladding region 23 includes a first p-type Group III nitride semiconductor layer 27 and a second p-type Group III nitride semiconductor layer 29. The first p-type Group III nitride semiconductor layer 27 comprises an InAlGaN layer and this InAlGaN layer incorporates anisotropic strain built therein. The second p-type Group III nitride semiconductor layer 29 comprises semiconductor different from a material of the InAlGaN layer and can be comprised, for example, of a material of the same constituent elements with a different composition, or a material of different numbers of constituent elements. In the second cladding region 23, the second p-type Group III nitride semiconductor layer 29 comprises a p-type gallium nitride based semiconductor, e.g., p-type GaN, p-type AlGaN, p-type InAlGaN, or the like. The first p-type Group III nitride semiconductor layer 27 is provided between the second p-type Group III nitride semiconductor layer 29 and the active layer 25. The resistivity p29 of the second p-type Group III nitride semiconductor layer 29 is lower than the resistivity p27 of the first p-type Group III nitride semiconductor layer 27.

In this nitride semiconductor laser 11, the second cladding region 23 includes the first and second p-type Group III nitride semiconductor layers 27, 29 the materials of which are different from each other and, for this reason, the second cladding region 23 can be one with excellent optical confinement, without the compositionally-graded profile for each of the first and second p-type Group III nitride semiconductor layers 27, 29. Furthermore, this first p-type Group III nitride semiconductor layer 27 is provided between the second p-type Group III nitride semiconductor layer 29 and the active layer 25. Holes propagates through the second p-type Group III nitride semiconductor layer 29 with the lower resistivity than that of the first p-type Group III nitride semiconductor layer 27, and then reach the first p-type Group III nitride semiconductor layer 27.

Since the InAlGaN layer of the first p-type Group III nitride semiconductor layer 27 includes the built-in anisotropic strain, holes in this InAlGaN layer has a smaller effective mass than those in InAlGaN grown on a c-plane. Hence, while the resistivity of the InAlGaN layer of the first p-type Group III nitride semiconductor layer 27 is higher than that of the second p-type Group III nitride semiconductor layer 29, the holes with the smaller effective mass undertake a role in conduction in the InAlGaN layer; therefore, when the holes reach the first p-type Group III nitride semiconductor layer 27 and propagate there, the dynamic electrical resistance in the InAlGaN layer becomes better than the value expected from the resistivity of the first p-type Group III nitride semiconductor layer 27, resulting in reduction in the forward drive voltage.

Accordingly, the present embodiment provides the nitride semiconductor laser 11 achieving a reduction of drive voltage while reducing degradation of optical confinement, and also provides the epitaxial substrate EP for this nitride semiconductor laser 11.

FIG. 2 is a drawing showing relations among strains, resistivities, bandgaps Eg, and p-type dopant concentrations in the two cladding layers in the p-type cladding region. With reference to part (a) of FIG. 2, the relation of strains and resistivities is shown. The p-type cladding region achieves the technical contribution of electrical conduction due to the resistivities of the two cladding layers and the effective masses therein, and also ensures the optical confinement provided by employment of the two cladding layers.

In the Group III nitride semiconductor laser device 11, the semiconductor region 19 includes a first end face 28a and a second end face 28b intersecting with an m-n plane defined by the m-axis of the hexagonal Group III nitride semiconductor and a normal axis NX. Furthermore, an electrode 15 is provided on the semiconductor region 19, and an electrode 41 is provided on the back surface 17b of the support substrate 17.

The first cladding layer 21, the second cladding layer 23, and the active layer 25 are arranged along the axis NX normal to the primary surface 17a of semipolar nature. The active layer 25 is provided between the first cladding layer 21 and the second cladding layer 23. The active layer 25 includes gallium nitride based semiconductor layers, and the gallium nitride based semiconductor layers are, for example, well layers 25a. The active layer 25 includes barrier layers 25b which comprises a gallium nitride based semiconductor, and the well layers 25a and barrier layers 25b are alternately arranged. The well layers 25a is made, for example, of InGaN or the like, and the barrier layers 25b are made, for example, of GaN, InGaN, or the like. The active layer 25 can include a quantum well structure provided so as to generate light at the wavelength of not less than 430 nm and not more than 570 nm, by use of a semipolar plane. The semiconductor laser device 11 is suitable for generation of light at the wavelength of not less than 480 nm and not more than 550 nm. This device can provide excellent optical confinement and a low drive voltage in the above wavelength range.

With reference to FIG. 1, there are an orthogonal coordinate system S and a crystal coordinate system CR illustrated. The normal axis NX is directed in the direction of the Z-axis of the orthogonal coordinate system S. The primary surface 17a extends in parallel with a predetermined plane defined by the X-axis and Y-axis of the orthogonal coordinate system S. A typical c-plane Sc is depicted in FIG. 1. In the example shown in FIG. 1, the c-axis of the Group III nitride semiconductor of the support substrate 17 is inclined toward the direction of the m-axis of the Group III nitride semiconductor at an angle ALPHA with respect to the normal axis NX.

The Group III nitride semiconductor laser 11 further comprises an insulating film 31 and a p-type contact region 33. The p-type contact region 33 is provided on the p-type cladding region 23. The bandgap energy of the p-type cladding region 23 is not less than that of the p-type contact region 33. Furthermore, a p-type dopant concentration of the second p-type Group III nitride semiconductor layer 29 is lower than that of the p-type contact region 33. The insulating film 31 covers a surface 19a of the semiconductor region 19 (p-type contact region 33). The insulating film 31 has an aperture 31a and the aperture 31a extends in a direction of a line LIX defined by the intersection of the surface 19a of the semiconductor region 19 with the aforementioned m-n plane, and has, for example, a stripe shape. The electrode 15 is in contact with the surface 19a of the semiconductor region 19 (e.g., p-type contact region 33) through the aperture 31a, and extends in the direction of the aforementioned intersecting line LIX. In the Group III nitride semiconductor laser 11, a laser waveguide includes the first cladding layer 21, the second cladding layer 23 and the active layer 25, and extends in the direction of the intersecting line LIX as aforementioned.

In the Group III nitride semiconductor laser 11, the first end face 28a and the second end face 28b intersect with the m-n plane defined by the m-axis of the hexagonal Group III nitride semiconductor and the normal axis NX. A laser cavity of the Group III nitride semiconductor laser device 11 includes the first and second end faces 28a, 28b, and the laser waveguide extends from one to the other of the first and second end faces 28a, 28b. The first and second end faces 28a, 28b are different from conventional cleaved facets such as c-planes, m-planes, or a-planes. In this Group III nitride semiconductor laser 11, the first and second end faces 28a, 28b that form the laser cavity intersect with the m-n plane. The laser waveguide extends in the direction of the intersecting line of the m-n plane and the semipolar surface 17a. The Group III nitride semiconductor laser 11 has the laser cavity enabling a low threshold current, and in emission of light in the active layer 25, an inter-band transition enabling lasing with the low threshold is selected.

As shown in FIG. 1, a dielectric multilayer film 43a, 43b can be provided on each of the first and second end faces 28a, 28b. An end-face coat is also applicable to the end faces 28a, 28b. The end-face coat allows adjustment of reflectance.

The Group III nitride semiconductor laser device 11 includes an n-side optical guiding region 35 and a p-side optical guiding region 37.

The n-side optical guiding region 35 can include an n-side optical guiding layer or plural n-side optical guiding layers. The p-side optical guiding region 37 can include a p-side optical guiding layer or plural n-side optical guiding layers. The n-side optical guiding region 35 includes, for example, an n-side first optical guiding layer 35a and an n-side second optical guiding layer 35b, and the n-side optical guiding region 35 is made, for example, of GaN, InGaN, or the like. The p-side optical guiding region 37 includes a p-side first optical guiding layer 37a and a p-side second optical guiding layer 37b, and the p-side optical guiding region 37 is made, for example, of GaN, InGaN, or the like. An electron blocking layer 39 is provided, for example, between the p-side first optical guiding layer 37a and the p-side second optical guiding layer 37b.

The second cladding region 23 will be described. With reference to part (b) of FIG. 1, the first p-type Group III nitride semiconductor layer 27 has a single bandgap energy E1 and the second p-type Group III nitride semiconductor layer 29 has a single bandgap energy E2. The bandgap energy E1 is preferably larger than the bandgap energy E2. The refractive index n1 of the first p-type Group III nitride semiconductor layer 27 is smaller than the refractive index n2 of the second p-type Group III nitride semiconductor layer 29, which can ensure good optical confinement in the p-side region.

The first and second p-type Group III nitride semiconductor layers 27, 29 are doped with a p-type dopant, e.g., magnesium (Mg), and the magnesium concentration of the first p-type Group III nitride semiconductor layer 27 is preferably smaller than that of the second p-type Group III nitride semiconductor layer 29. Since the magnesium concentration of the first p-type Group III nitride semiconductor layer 27 is smaller than that of the second p-type Group III nitride semi-conductor layer 29, it is feasible to suppress increase of optical loss due to optical absorption of the dopant and reduction in carrier mobility due to ion scattering of dopant ions.

The bandgap energy E1 of the first p-type Group III nitride semiconductor layer 27 is set larger than that E2 of the second p-type Group III nitride semiconductor layer 29, so as to improve the optical confinement. Furthermore, the magnesium concentration of the first p-type Group III nitride semiconductor layer 27 is set smaller than that of the second p-type Group III nitride semiconductor layer 29, so as to reduce the increase of absorption loss and the degradation in carrier mobility in the first p-type Group III nitride semiconductor layer 27.

For example, the bandgap of the first p-type Group III nitride semiconductor layer 27 is preferably not less than 3.47 electron volts (eV) and not more than 3.63 eV. This range of bandgap Eg corresponds to the wavelengths of 342 nm to 357 nm. With this range, we can obtain the refractive index suitable for confinement of light at the wavelengths of 480 nm to 550 nm. In this device, the first p-type Group III nitride semiconductor layer 27 is closer to the active layer 25 than the second p-type Group III nitride semiconductor layer 29, and the aforementioned bandgap values enable excellent optical confinement for the GaN-based light emitting device.

For example, the magnesium concentration of the first p-type Group III nitride semiconductor layer 27 can be not less than $8 \times 10^{17}$ cm$^{-3}$. When the magnesium concentration is in this range, the resistivity of the first p-type Group III nitride semiconductor layer 27 is kept low. The magnesium concentration of the first p-type Group III nitride semiconductor layer 27 can be not more than $2 \times 10^{19}$ cm$^{-3}$. When the magnesium concentration is in this range, the mobility reduction caused by ion scattering is not significant, and there is no significant influence on increase of threshold current due to the absorption loss.

The magnesium concentration of the second p-type Group III nitride semiconductor layer 29 can be not less than $7 \times 10^{18}$ cm$^{-3}$. When the magnesium concentration is in this range, a free hole concentration can be made higher. The magnesium concentration of the second p-type Group III nitride semiconductor layer 29 can be not more than $5 \times 10^{19}$ cm$^{-3}$. When the magnesium concentration exceeds this range, the crystallinity becomes likely to degrade and it becomes difficult to grow, with excellent crystallinity, a cladding layer of film thickness enough for optical confinement.

With reference to part (b) of FIG. 2, there is shown the relation among strains, resistivities, and bandgaps Eg. While achieving the technical contribution of electrical conduction due to the resistivities and effective masses that are provided by employment of the two cladding layers, the optical confinement is also ensured based on the profile of bandgaps Eg (refractive indices).

With reference to part (c) of FIG. 2, there is shown the relation among strains, resistivities, bandgaps Eg, and p-type dopant concentrations in the p-type cladding region. While achieving the technical contribution of electrical conduction due to the resistivities and effective masses that are provided by employment of the two cladding layers, the optical confinement is ensured based on the profile of bandgaps Eg (refractive indices), and this configuration further achieves suppression of increase of threshold current and reduction of drive current, based on the Mg dopant concentration profile.

The high bandgap and the low dopant concentration are given to the first p-type Group III nitride semiconductor layer 27. It is difficult to provide the first p-type Group III nitride semiconductor layer 27 with a low resistivity, in addition thereto. The reason for it is that when the hole density of the first p-type Group III nitride semiconductor layer 27 is set high, an increase of the p-type dopant concentration to decrease the resistivity leads to an increase in carrier scattering by p-type dopant ions.

Although the resistivity of the first p-type Group III nitride semiconductor layer 27 is rather high, the mobility in the InAlGaN layer including the built-in compressive strain is high, and thus the dynamic electrical resistance can be lowered by dynamically increasing the hole concentration. The increase of hole concentration can be implemented by holes which flow during laser driving from the second p-type Group III nitride semiconductor layer 29 of the lower resistivity into the first p-type Group III nitride semiconductor layer 27. The laser driving increases the hole concentration of the first p-type Group III nitride semiconductor layer 27 to lower the electrical resistance.

As described above, the p-type dopant concentration of the first p-type Group III nitride semiconductor layer 27 is set lower than that of the second p-type Group III nitride semiconductor layer 29, thereby reducing the ion scattering caused by the p-type dopant. This is effective in improvement in mobility. This reduction of p-type dopant concentration also reduces the optical absorption in the first p-type Group III nitride semiconductor layer 27.

FIG. 3 is a drawing showing possible structures for the first and second p-type Group III nitride semiconductor layers in the p-type cladding region. It is considered that when InAlGaN on a semipolar plane includes built-in anisotropic strain without causing relaxation, this strain splits degeneracy of valence bands to decrease the hole effective mass.

When the second p-type Group III nitride semiconductor layer 29 is made of GaN, as shown in part (a) of FIG. 3, it is easier to decrease the resistivity of the second p-type Group III nitride semiconductor layer 29, when compared to ternary and quaternary nitride semiconductors. Namely, it is feasible to obtain the technical contributions based on the low resistivity, provided by GaN, and the small effective mass provided by the InAlGaN layer.

As shown in part (b) of FIG. 3, the second p-type Group III nitride semiconductor layer 29 is made of AlGaN, and this AlGaN includes built-in anisotropic strain. This facilitates flow of holes from the second p-type Group III nitride semiconductor layer 29 into the first p-type Group III nitride semiconductor layer 27.

When the second p-type Group III nitride semiconductor layer 29 includes the AlGaN layer with built-in strain, this AlGaN layer makes a junction with the underlying InAlGaN layer 27, and includes built-in anisotropic strain. This strain can decrease the effective mass of holes in the AlGaN layer of the second p-type Group III nitride semiconductor layer 29. Hence, it becomes easier that holes flow into the first p-type Group III nitride semiconductor layer 27.

When the second p-type Group III nitride semiconductor layer 29 is made of InAlGaN and makes a junction with the underlying InAlGaN layer 27 and this InAlGaN includes built-in anisotropic strain, as shown in part (c) of FIG. 3, the hole effective mass of the second p-type Group III nitride semiconductor layer 29 also decreases. This decrease in effective mass is effective in terms of facilitating flow of holes from the second p-type Group III nitride semiconductor layer 29 into the first p-type Group III nitride semiconductor layer 27. Namely, it is feasible to obtain the technical contributions from the low resistivity of the InAlGaN layer and the small effective mass that the InAlGaN layer provides.

In a quaternary nitride semiconductor, the bandgap and lattice constants can be determined independently of each other, as compared to a ternary nitride semiconductor. This is useful for adjustment of lattice mismatch. It is necessary to have high Al and In compositions of InAlGaN, for increase in bandgap Eg, and lattice matching becomes complicated in InAlGaN of the first p-type Group III nitride semiconductor layer 27. In the case of InAlGaN provided on a semipolar plane, it is infeasible to achieve lattice matching with GaN simultaneously in both of an inclination direction of the c-axis (which will be referred to hereinafter as "off direction") and a direction perpendicular to this off direction. The reason for it is that ratios c/a of lattice constants are different among GaN, AlN, and InN. It becomes infeasible to achieve the reduction effect of effective mass, because of relaxation of InAlGaN.

The structure in which the first and second p-type Group III nitride semiconductor layers 27, 29 both are made of InAlGaN is more suitable in terms of the optical confinement and the reduction of drive voltage than the other two structures.

In the p-type cladding regions shown in part (a), part (b), and part (c) of FIG. 3, no substantial misfit dislocations are formed at the interface between the first and second p-type Group III nitride semiconductor layers 27, 29. The second cladding region 23 is grown on the light emitting layer 13, but no substantial misfit dislocations enough to cause relaxation are formed at the interface between the second cladding region 23 and the light emitting layer 13.

The semiconductor region 19 on the support substrate 17 includes the plural Group III nitride semiconductor layers (21, 13, 23, 33), which are arranged in the direction of the axis NX normal to the primary surface 17a of the support substrate 17. In the semiconductor region 19, there are a plurality of junctions (interfaces) formed by these Group III nitride semiconductor layers, and no misfit dislocations enough to cause relaxation are formed at these interfaces. For this reason, when the primary surface 17a of the support substrate 17 is made, for example, of GaN, each of the Group III nitride semiconductor layers in the semiconductor region 19 includes built-in strain depending upon the difference between the lattice constants thereof and the lattice constants of GaN.

As described previously, since InAlGaN on a semipolar plane has the different ratios c/a of lattice constants among GaN, AlN, and InN, it is infeasible to achieve lattice matching with GaN simultaneously in both of the inclination direction of the c-axis (i.e., the off direction) and the direction that is perpendicular to the off direction. This will be described using examples of InAlGaN on a GaN substrate.

(Form 1 of Lattice Matching)

When the support substrate 17 is a GaN substrate, the lattice constant D1(GaN) of the c-axis of this GaN substrate has a component D1(GaN)p parallel to the primary surface 17a of the support substrate 17 and a component D1(GaN)n perpendicular to the primary surface 17a of the support substrate 17. The lattice constant D1(InAlGaN) of the c-axis in the InAlGaN layer of the first p-type Group III nitride semiconductor layer 27 has a component $D1(InAlGaN)_p$ parallel to the primary surface 17a of the support substrate 17 and a component D1(InAlGaN)n perpendicular to the primary surface 17a of the support substrate 17. When lattice mismatch degree R1p in the InAlGaN layer is defined as follows: (D1(InAlGaN)p−D1(GaN)p)/D1(GaN)p, this lattice mismatch degree R1p is not less than −0.15% and not more than +0.2%.

In this structure, no misfit dislocations are created in the first p-type Group III nitride semiconductor layer 27 with the large bandgap. The aforementioned condition is intended for lattice matching of the lattice constant associated with the c-axis which is one of the two crystal axes associated with the lattice matching, and thus the first p-type Group III nitride semiconductor layer 27 is strained in the other axis (the a-axis or the m-axis). The aforementioned effective mass reduction effect can be caused by this anisotropic strain.

(Form 2 of Lattice Matching)

When the support substrate 17 is a GaN substrate, the lattice constant D2(GaN) of the crystal axis (a-axis or m-axis) perpendicular to the c-axis of this GaN substrate has a component D2(GaN)p parallel to the primary surface 17a of the support substrate 17 and a component D2(GaN)n perpendicular to the primary surface 17a of the support substrate 17. The lattice constant D2(InAlGaN) of the crystal axis perpendicular to the c-axis of the InAlGaN layer of the first p-type Group III nitride semiconductor layer 27 has a component D2(InAlGaN)p parallel to the primary surface 17a of the support substrate 17 and a component D2(InAlGaN)n perpendicular to the primary surface 17a of the support substrate 17. When lattice mismatch degree R2p in the InAlGaN layer is defined as (D2(InAlGaN)p−D2(GaN)p)/D2(GaN)p, this lattice mismatch degree R2p is not less than −0.15% and not more than +0.2%. When the off direction is accurately oriented to the a-axis or the m-axis, D2(GaN)n and D2(InAlGaN)n are zero. When the off direction is slightly shifted from the a-axis or the m-axis, D2(GaN)n and D2(InAlGaN)n are very small values which is close to zero.

In this structure, no misfit dislocations are created in the first p-type Group III nitride semiconductor layer 27 with the large bandgap. It is intended for lattice matching of the lattice constant perpendicular to the c-axis which is one of the two crystal axes associated with the lattice matching, and the first p-type Group III nitride semiconductor layer 27 is strained in the other c-axis direction. The aforementioned effective mass reduction effect can be achieved by this anisotropic strain.

(Form 3 of Lattice Matching)

The support substrate 17 is a GaN substrate, and the c-axis of this GaN substrate is inclined toward one crystal axis (the m-axis herein) out of the a-axis and m-axis of the GaN substrate. The lattice constant D1(GaN) of the c-axis of the GaN substrate has a component D1(GaN)p parallel to the primary surface 17a of the support substrate 17 and a component D1(GaN)n perpendicular to the primary surface 17a of the support substrate 17. The lattice constant D1(InAlGaN) of the c-axis in the InAlGaN layer of the first p-type Group III nitride semiconductor layer 27 has a component D1(InAlGaN)$_p$ parallel to the primary surface 17a of the support substrate 17 and a component D1(InAlGaN)n perpendicular to the primary surface 17a of the support substrate 17. Lattice mismatching degree R1p in this InAlGaN layer is defined as follow: (D1(InAlGaN)p−D1(GaN)p)/D1(GaN)p. This lattice mismatch degree R1p is not less than −0.15% and not more than 0%. In the form in which the c-axis is inclined toward the m-axis, lattice mismatch degree R2p as to the a-axis in the InAlGaN layer of the first p-type Group III nitride semiconductor layer 27 is defined as follows: (D2(InAlGaN)p−D2(GaN)p)/D2(GaN)p. This lattice mismatch degree R2p satisfies the condition of not less than 0% and not more than 0.2%. Here, D2(InAlGaN)p is perpendicular to D1(InAlGaN)p, and D2(GaN)p is perpendicular to D1(GaN)p.

This structure is not intended for lattice matching of either one crystal axis out of the two crystal axes associated with the lattice matching. Namely, the InAlGaN layer is strained within a certain small range in both of the two crystal axes. In the case of InAlGaN of the first p-type Group III nitride semiconductor layer 27 with the large bandgap, when it is lattice-matched in one of the crystal axes, the lattice mismatch degree becomes larger in the other axis, raising a possibility of relaxation of InAlGaN of the second p-type Group III nitride semiconductor layer 29. When such InAlGaN is used, provision of a composition lattice-mismatched in both of the crystal axes but having the low lattice mismatch degrees for InAlGaN is effective in avoidance of relaxation. The aforementioned effective mass reduction can be provided by the anisotropic strains of the two axes.

The cladding region functions to confine light in the optical waveguide inside the cladding region. When the second cladding region 23 (p-type cladding region) has two semiconductor layers, sufficient optical confinement cannot be provided by only one semiconductor layer of the p-type cladding region, but the total thickness of the two semiconductor layers of the second cladding region 23 is enough for optical confinement, whereby sufficient optical confinement is provided by these two layers.

For example, the thickness d23 of the second cladding region 23 is preferably not less than 300 nm and not more than 1000 nm. When the thickness d23 of the second cladding region 23 is not less than 300 nm, optical confinement in the light emitting layer 13 is excellent, so as to suppress leakage of light into the p-type contact region 33 and the electrode 15. When the thickness d23 of the second cladding region 23 is not more than 1000 nm, increase of drive voltage due to increase in the component of series resistance is suppressed.

The first and second p-type Group III nitride semiconductor layers 27, 29 have the thicknesses d1 and d2, respectively. The thickness d2 of the second p-type Group III nitride semiconductor layer 29 preferably satisfies the condition of $0.2 \leq d2/(d1+d2) \leq 0.6$. When the thickness d2 of the second p-type Group III nitride semiconductor layer 29 has a value in the foregoing range, the second p-type Group III nitride semiconductor layer 29, together with the first p-type Group III nitride semiconductor layer 27 having the remaining thickness d1, can provide an excellent optical confinement and a low drive voltage. For example, the second p-type Group III nitride semiconductor layer 29 having the thickness d2 in the aforementioned range serves to reduce the drive voltage because of its low resistivity, and the first p-type Group III nitride semiconductor layer 27 having the remaining thickness of the aforementioned range serves to reduce the drive voltage because of its small effective mass. The first and second p-type Group III nitride semiconductor layers 27, 29 having the respective thicknesses in the aforementioned range are thicker than the thickness of the contact region 33 necessary for excellent contact with the electrode 15.

The thickness of the first p-type Group III nitride semiconductor layer 27 is smaller than the critical film thickness that is based on the material thereof. This can avoid relaxation of the first p-type Group III nitride semiconductor layer 27. The thickness of the second p-type Group III nitride semiconductor layer 29 is smaller than the critical film thickness that is based on the material thereof. This can avoid relaxation of the second p-type Group III nitride semiconductor layer 29.

As described previously, the primary surface 17a of the support substrate 17 (substrate of the epitaxial substrate EP) exhibits semipolar nature. The angle ALPHA between the primary surface (primary surface of the substrate of the epitaxial substrate EP) 17a and the reference axis Cx is preferably in the range of not less than 10 degrees and not more than 80 degrees or in the range of not less than 100 degrees and not more than 170 degrees. When the inclination of the primary surface 17a of the support substrate 17 falls in this angle range, the hole effective mass is made sufficiently small, thereby effectively generating the effect of the p-type cladding region 23 including the first and second p-type Group III nitride semiconductor layers 27 and 29.

Furthermore, the angle ALPHA between the primary surface 17a and the reference axis Cx is preferably in the range of not less than 63 degrees and not more than 80 degrees or in the range of not less than 100 degrees and not more than 117 degrees. When the inclination of the primary surface 17a falls in this angle range, the underlying semipolar surface (i.e., the primary surface 17a) for growth of the InAlGaN layer demonstrates excellent indium incorporation in growth of the InAlGaN layer. Thanks to the excellent In incorporation, InAlGaN can be grown with excellent crystallinity and it becomes easier to provide the InAlGaN layer with excellent electrical conduction for the double cladding structure. In this case, the c-axis is preferably inclined in the direction from the c-axis toward the m-axis of the gallium nitride based semiconductor.

Referring again to FIG. 1, the p-type contact region 33 is provided so as to make a junction with the second cladding region 23 and the electrode 15 is provided so as to make a junction with the p-type contact region 33. The thickness of the p-type contact region 33 is, for example, less than 300 nm and the thickness of the p-type contact region 33 can be, for example, not less than 10 nm.

In the second cladding region 23, the bandgap energy E2 of the second p-type Group III nitride semiconductor layer 29 is preferably not less than the bandgap energy Ec of the p-type contact region 33. This structure serves to reduce the drive voltage because holes are supplied from the p-type contact region 33 with the small bandgap energy and small activation energy of the acceptor into second p-type Group III nitride semiconductor layer 29 with the low-resistivity.

In the second cladding region 23, the p-type dopant concentration of the p-type contact region 33 is preferably higher than that of the second cladding region 23. This structure serves to reduce the drive voltage because holes are supplied from the p-type contact region 33 with the high dopant concentration into the second p-type Group III nitride semiconductor layer 29 with the low resistivity. Furthermore, the contact resistance of the electrode can be decreased.

EXAMPLE 1

Figure 4:
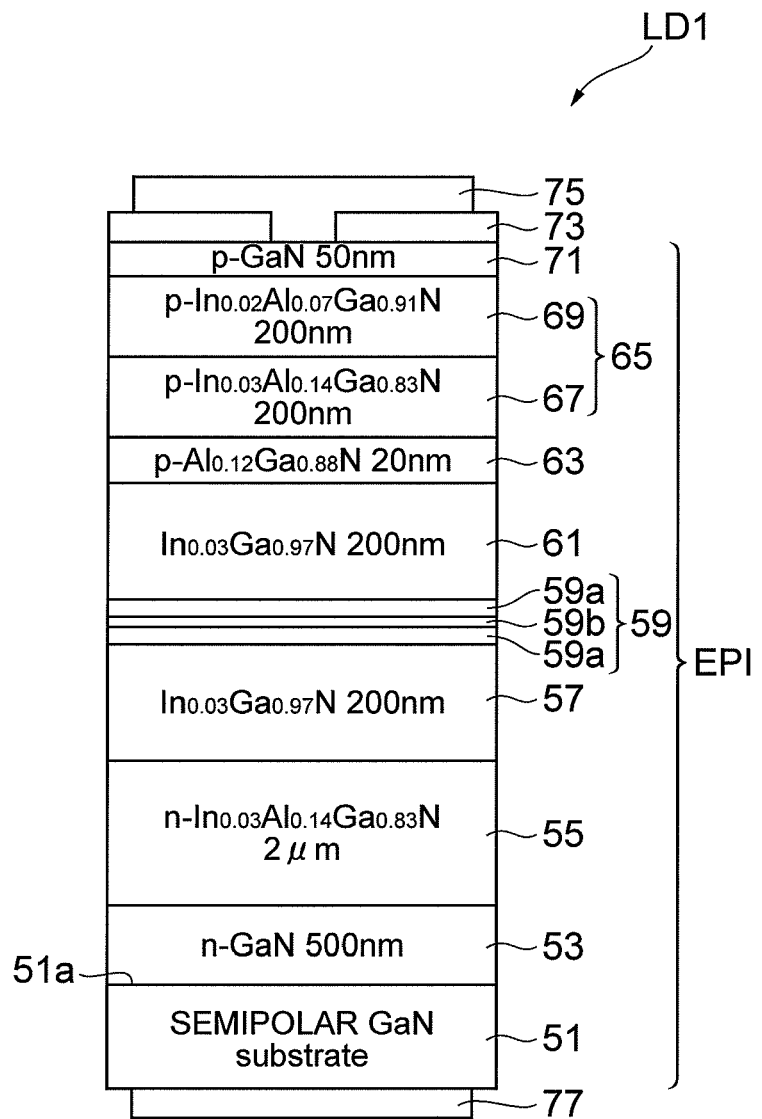
FIG. 4 is a drawing schematically showing a structure of a Group III nitride semiconductor laser fabricated in Example 1.
Figure 5:
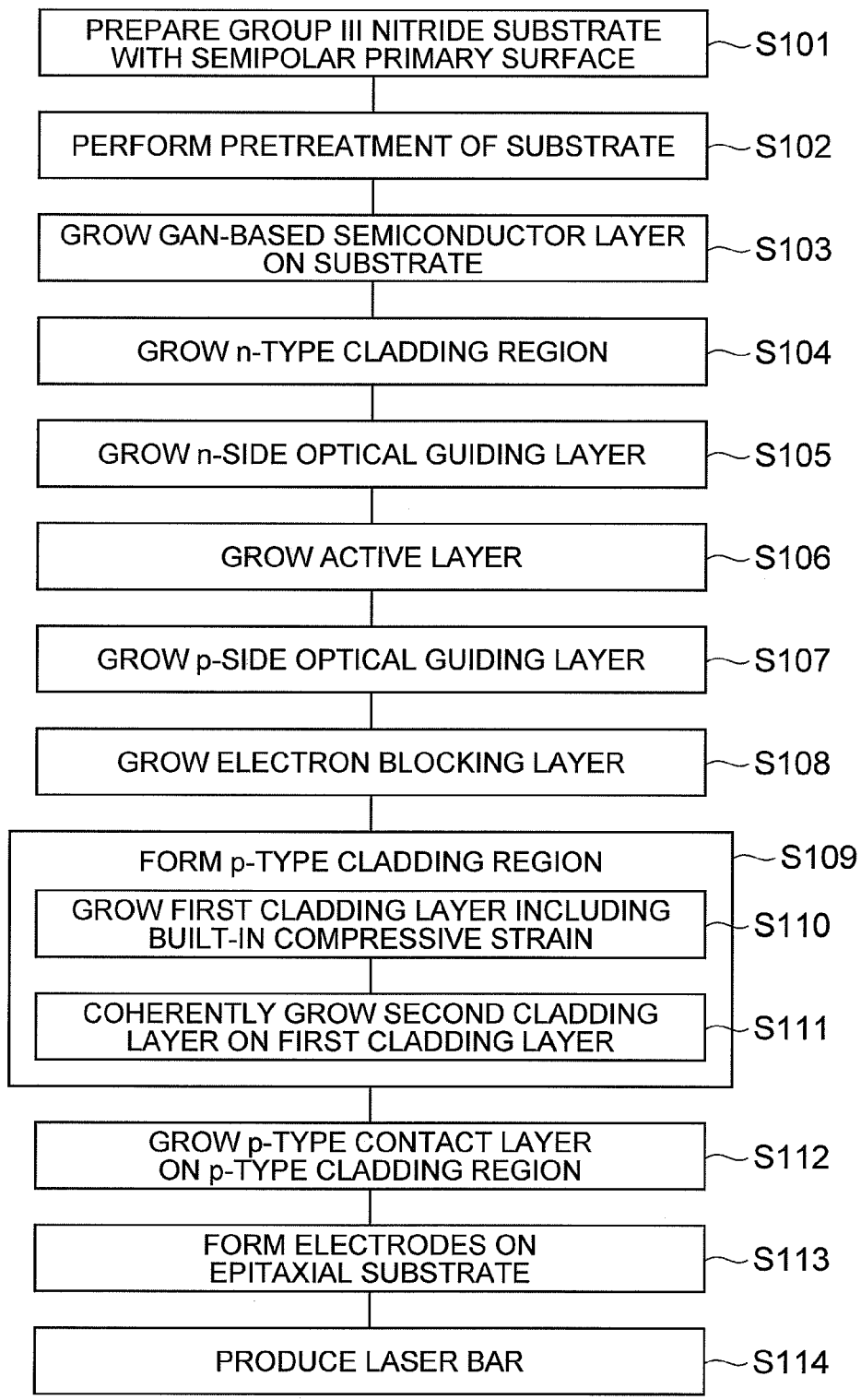
FIG. 5 is a drawing showing a step flow of fabricating the Group III nitride semiconductor laser in Example 1.

FIG. 4 is a drawing schematically showing a structure of a Group III nitride semiconductor laser fabricated in Example 1. This Group III nitride semiconductor laser is fabricated according to the step flow shown in FIG. 5.

In Step S101, a Group III nitride substrate having a semipolar primary surface is prepared. In the present example, the substrate prepared as above is a GaN substrate 51 with a semipolar primary surface inclined at the angle of 75 degrees toward the m-axis direction. The plane orientation of this semipolar primary surface corresponds to a (20-21) plane. A semiconductor region having an LD structure LD1 to operate in the 520 nm lasing wavelength band is grown on the semipolar primary surface of this GaN substrate 51.

In Step S102, the GaN substrate 51 is placed in a growth reactor and thereafter a pretreatment (thermal cleaning) of the GaN substrate 51 is performed therein. This pretreatment is carried out under the conditions of the thermal treatment temperature of 1050 degrees Celsius and the treatment time of ten minutes in an atmosphere containing ammonia and hydrogen.

After this pretreatment, in step S103, a gallium nitride based semiconductor layer such as an n-type GaN layer 53 is grown on the GaN substrate 51 at the growth temperature of 1050 degrees Celsius. The thickness of the n-type GaN layer 53 is, for example, 500 nm. In Step S104, an n-type cladding region is grown on this gallium nitride based semiconductor layer. The n-type cladding region includes, for example, an InAlGaN layer 55 grown at the growth temperature of 840 degrees Celsius. The thickness of this n-type cladding region is, for example, 2 μm. The n-type InAlGaN layer 55 includes built-in anisotropic strain. In Step S105, an n-side optical guiding layer is grown on the n-type cladding region. In the present example, the n-side optical guiding layer includes, for example, an n-type InGaN layer 57 grown at the growth temperature of 840 degrees Celsius. The thickness of the n-type InGaN layer 57 is, for example, 200 nm. The n-type InGaN layer 57 includes built-in compressive strain.

In Step S106, an active layer 59 is grown on the n-side optical guiding layer. The active layer 59 includes barrier layers and a well layer. In the present example, the barrier layers include, for example, GaN layers 59a grown at the growth temperature of 840 degrees Celsius and the thickness of the GaN layers 59a is, for example, 15 nm. The well layer includes, for example, an $In_{0.3}Ga_{0.7}N$ layer 59b grown at the growth temperature of 790 degrees Celsius and the thickness of the InGaN layer 59b is, for example, 3 nm. This InGaN layer 59b includes built-in compressive strain.

In Step S107, a p-side optical guiding layer is grown on the active layer 59. In the present example, the p-side optical guiding layer includes, for example, an InGaN layer 61 grown at the growth temperature of 840 degrees Celsius. The thickness of the p-side InGaN layer 61 is, for example, 200 nm. The p-side InGaN layer 61 includes built-in compressive strain.

In Step S108, an electron blocking layer is grown on the p-side optical guiding layer. In the present example, the electron blocking layer includes, for example, a p-type $Al_{0.12}Ga_{0.88}N$ layer 63 grown at the growth temperature of 1000 degrees Celsius. The thickness of the $Al_{0.12}Ga_{0.88}N$ layer 63 is, for example, 20 nm. The $Al_{0.12}Ga_{0.88}N$ layer 63 includes built-in tensile strain.

In Step S109, a p-type cladding region 65 is grown on the electron blocking layer. In the growth of the p-type cladding region 65, step S110 is first carried out to grow a first cladding layer on the electron blocking layer. The first cladding layer is a p-type $In_{0.03}Al_{0.14}Ga_{0.83}N$ layer 67. This p-type $In_{0.03}Al_{0.14}Ga_{0.83}N$ layer 67 is grown, for example, at the growth temperature of 840 degrees Celsius. The thickness of this p-type $In_{0.03}Al_{0.14}Ga_{0.83}N$ layer 67 is, for example, 200 nm. The p-type $In_{0.03}Al_{0.14}Ga_{0.83}N$ layer 67 makes a junction with the electron blocking layer, and includes built-in anisotropic strain.

In the growth of the p-type cladding region, step S111 is then carried out to coherently grow a second cladding layer on the first cladding layer. The second cladding layer is grown as a p-type $In_{0.02}Al_{0.07}Ga_{0.91}N$ layer 69. This p-type $In_{0.02}Al_{0.07}Ga_{0.91}N$ layer 69 is grown, for example, at the growth temperature of 840 degrees Celsius. The thickness of this p-type $In_{0.02}Al_{0.07}Ga_{0.91}N$ layer 69 is, for example, 200 nm. The p-type $In_{0.02}Al_{0.07}Ga_{0.91}N$ layer 69 makes a junction with the first cladding layer and includes built-in anisotropic strain.

In the present example, the resistivity of $In_{0.03}Al_{0.14}Ga_{0.83}N$ of the first cladding layer is, for example, 50 Ω·cm, and the resistivity of $In_{0.02}Al_{0.07}Ga_{0.91}N$ of the second cladding layer is, for example, 8 Ω·cm. The Mg concentration of the first cladding layer is, for example, $6 \times 10^{18}$ $cm^{-3}$, and the Mg concentration of the second cladding layer is, for example, $1 \times 10^{19}$ $cm^{-3}$. The bandgap energy of the first cladding layer is, for example, 3.54 electron volts (eV) and the bandgap energy of the second cladding layer is, for example, 3.48 eV. "1 eV" corresponds to $1.602 \times 10^{-19}$ joules. InAlGaN of the first cladding layer is approximately lattice-matched with GaN as to the a-axis direction, and has the lattice mismatch degree of −0.24% with GaN as to the inclination direction of the c-axis. InAlGaN of the second cladding layer has the lattice mismatch degree of +0.05% with GaN as to the a-axis direction and the lattice mismatch degree of −0.08% as to the inclination direction of the c-axis.

In Step S112, a p-type contact layer 71 is grown on the p-type cladding region 65. In the present example, the p-type contact layer 71 includes, for example, a GaN layer grown at the growth temperature of 1000 degrees Celsius. The thickness of the p-type contact layer 71 is, for example, 50 nm. An epitaxial substrate EP1 is fabricated through these steps.

In Step S113, an insulating film is grown on the p-type contact layer 71, and a stripe window is formed from this insulating film by wet etching so as to extend in a direction of a laser waveguide, thereby forming a protecting insulating layer 73. The width of the stripe window is, for example, 10 µm. An anode electrode 75 is formed on the p-type contact layer 71 and the protecting insulating layer 73, and a cathode electrode is formed on the back surface of the GaN substrate. The anode electrode 75 is in direct contact with the p-type contact layer 71 through the stripe window. The anode electrode 75 includes an ohmic electrode made of Ni/Au and a pad electrode made of Ti/Au, and these are formed by evaporation. The cathode electrode 77 includes an ohmic electrode made of Ti/Al and a pad electrode made of Ti/Au, and these are formed by evaporation. These steps result in producing a substrate product from the epitaxial substrate EP 1.

In Step S114, a laser bar is produced from the substrate product. The cavity length of the laser bar is 600 µm. Dielectric multilayer films are grown on the respective laser end faces of the laser bar. The dielectric multilayer films are made, for example, of multilayer films of $SiO_2/TiO_2$.

Besides the fabrication of the above-described LD structure, another LD structure fabricated is an LD structure LC1 including a p-cladding region of a single p-type cladding layer (p-type $In_{0.03}Al_{0.14}Ga_{0.83}N$ layer, the thickness: 400 nm). The LD structure LC1 has the same structure as the LD structure LD1, except for the structure of the p-type cladding region.

Figure 6:
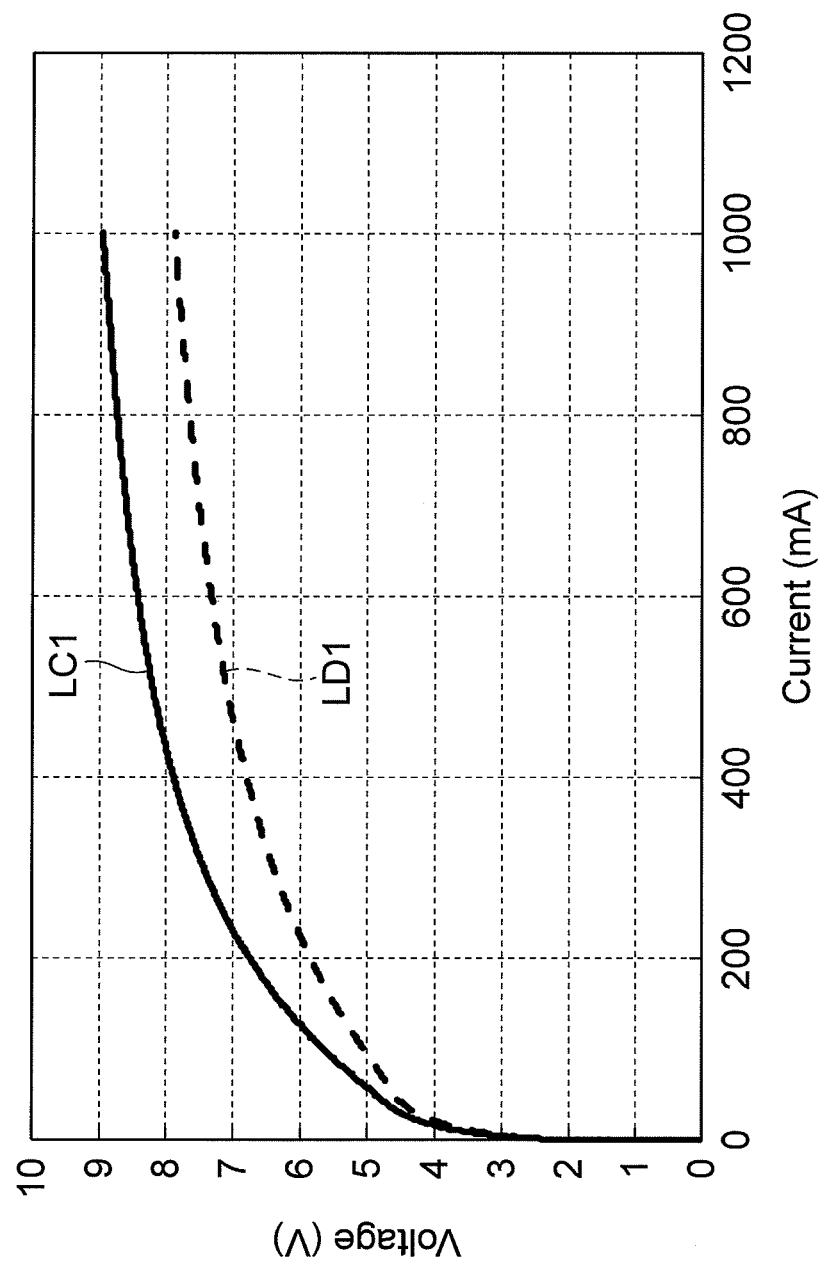
FIG. 6 is a drawing showing drive characteristics (I-V curves) of semiconductor laser LD1 in Example 1 and semiconductor laser LC1.

FIG. 6 is a drawing showing drive characteristics (I-V curves) of the semiconductor laser LD1 in Example 1 and the semiconductor laser LC1. The I-V curve of the semiconductor laser LD1 in Example 1 is below the I-V curve of the semiconductor laser LC1, and this indicates reduction of the drive voltage of the semiconductor laser LD1. The drive voltage Vf of the semiconductor laser LD1 (voltage at the drive current of 600 mA) is, for example, 7.3 V, and the drive voltage Vf of the semiconductor laser LC1 is, for example, 8.4 V. The threshold currents of the semiconductor laser LD1 in Example 1 and the semiconductor laser LC1 both are about 600 mA to 700 mA and thus there is no significant difference recognized between them. With reference to FIG. 6, it is shown that the structure of the two cladding layers of the semiconductor laser LD1 in Example 1 can reduce the drive voltage (Vf), without degradation of optical confinement.

When the epitaxial substrate of Example 1 is observed by the cross-section TEM method, there are no misfit dislocations recognized at any of the interface between the electron blocking layer and the first cladding layer, the interface between the second cladding layer and the contact layer, and the interface between the first and second cladding layers in the semiconductor laser LD1. Therefore, the electron blocking layer and the first and second cladding layers all include built-in strain.

According to Inventors' knowledge, the value of 50 Ω·cm as the resistivity of the semiconductor used for the cladding layer is a relatively large value. But, the drive voltage (Vf) is reduced in laser operation. A conceivable reason for it is that the effective mass of $In_{0.03}Al_{0.14}Ga_{0.83}N$ with built-in anisotropic strain is made reduced by on the semipolar plane, which allows holes flowing into $In_{0.03}Al_{0.14}Ga_{0.83}N$ to efficiently move. Furthermore, growth of this $In_{0.03}Al_{0.14}Ga_{0.83}N$ with excellent crystal quality is technical contribution provided by the semipolar plane with uniform indium incorporation, which is not achieved on a c-plane.

It is considered that the p-type cladding region comprises the InAlGaN layer including built-in anisotropic strain on this semipolar plane and the gallium nitride based semiconductor layer having the resistivity smaller than that of this InAlGaN layer and that in the p-type cladding region, combination of conduction by the low resistivity with conduction by high mobility leads to the prominent technical contribution to the low drive voltage.

EXAMPLE 2

Figure 7:
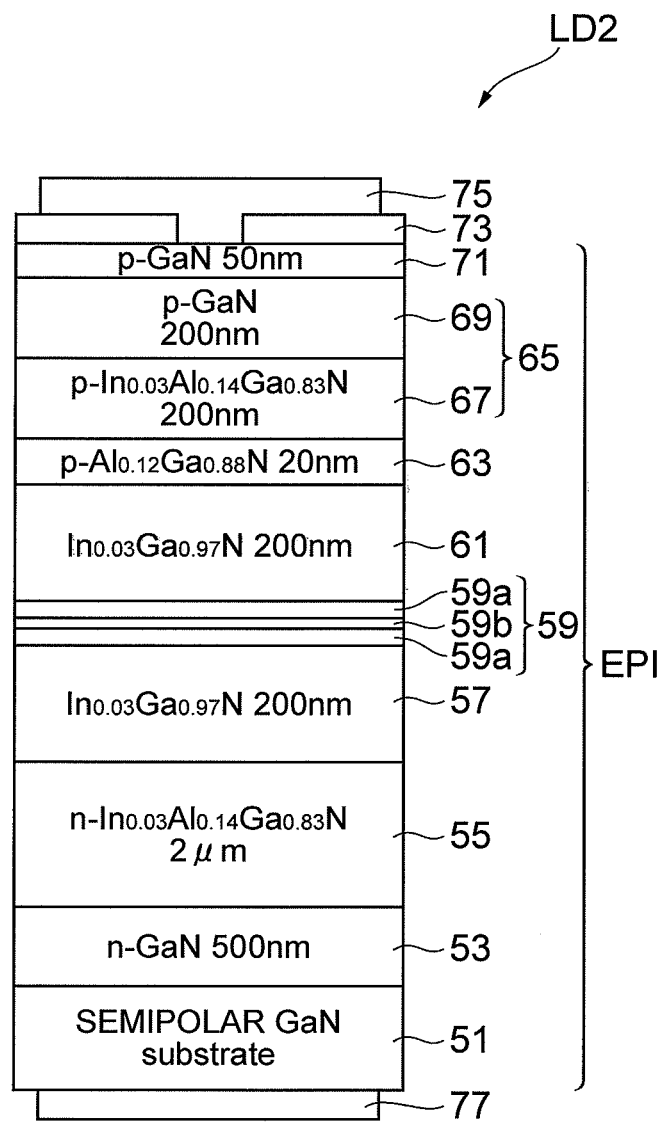
FIG. 7 is a drawing schematically showing a structure of a Group III nitride semiconductor laser fabricated in Example 2.

FIG. 7 is a drawing schematically showing a structure of a Group III nitride semiconductor laser fabricated in Example 2. The semiconductor laser LD2 in Example 2 has a p-type GaN layer 68 is grown instead of the InAlGaN layer 69 of the second cladding layer in the semiconductor laser LD1. The resistivity of the p-type GaN layer 68 of the second cladding layer is, for example, 3 Ω·cm and the Mg concentration of the p-type GaN layer 68 is, for example, $1 \times 10^{19}$ cm$^{-3}$. The drive voltage Vf of the semiconductor laser LD2 is reduced by 0.8 V from the drive voltage Vf of the semiconductor laser LD1. The threshold current of the semiconductor laser LD2 is approximately 800 mA-900 mA.

EXAMPLE 3

FIG. 8 is a drawing schematically showing structures of Group III nitride semiconductor lasers fabricated in Example 3. With reference to part (a), part (b), and part (c) of FIG. 8, the p-type cladding region includes a p-type InAlGaN layer making a junction with the light emitting layer and a GaN layer making a junction with this p-type InAlGaN layer.

When the structure of the optical guiding layer is changed from the optical guiding layer in Example 2 using the p-type GaN layer as the second cladding layer, this change can achieve the effect of reduction of threshold current. As shown in part (a) of FIG. 8, the indium compositions in InGaN of the p-side and n-side optical guiding layers are preferably a value larger than 0.03, e.g., 0.04 or more. In this example, since the indium compositions of the n-side and p-side InGaN optical guiding layers both are not less than the foregoing value, the refractive indices of these InGaN optical guiding layers can be made high. Therefore, it can provide the light emitting device with excellent optical confinement as a whole of the optical waveguide.

In another example, as shown in part (b) of FIG. 8, the indium composition of the n-side InGaN optical guiding layer is preferably larger than that of the p-side InGaN optical guiding layer. A product of the thickness and the indium composition of the n-side InGaN optical guiding layer is 8, and a product of the thickness and the indium composition of the p-side InGaN optical guiding layer is 4; therefore, the product of the n-side InGaN optical guiding layer is larger. Since in this example the indium composition of the n-side InGaN optical guiding layer is larger than that of the p-side InGaN optical guiding layer, a peak of electric field distribution of light propagating in the optical waveguide including the active layer is shifted to the n-type region and the light emitting device can be provided with excellent optical confinement as a whole of the optical waveguide even if the refractive index of the p-type cladding region is slightly higher than a value desired for optical confinement, in order to achieve the low drive voltage. This structure can achieve sufficient optical confinement even if the refractive index of the p-type cladding region is rather high. When compared to the structure in which the indium compositions of the optical guiding layers are increased, application of asymmetric indium compositions to the p-side and n-side optical guiding layers can expand a tolerable range about deviation from a designed value.

In still another example, as shown in part (c) of FIG. 8, the thickness of the n-side InGaN optical guiding layer is preferably larger than the thickness of the p-side InGaN optical guiding layer. The product of the thickness and the indium composition of the n-side InGaN optical guiding layer is 7.5 and the product of the thickness and the indium composition of the p-side InGaN optical guiding layer is 4.5; therefore, the product of the n-side InGaN optical guiding layer is larger. Since in this example the thickness of the n-side InGaN optical guiding layer is made larger than the thickness of the p-side InGaN optical guiding layer, a peak of electric field distribution of light propagating in the optical waveguide including the active layer is shifted to the n-type region and the light emitting device can be provided with excellent optical confinement as a whole of the optical waveguide even if the refractive index of the p-type cladding region is slightly higher than a value desired for optical confinement, in order to achieve the low drive voltage.

Example 3 illustrates the examples wherein the second cladding layer is the GaN layer, but the same technical contribution is also achieved with the second cladding layer of AlGaN or InAlGaN.

Based on the structure in part (c) of FIG. 8 in Example 3, LDs are fabricated with change in thickness ratio of the p-type InAlGaN layer and p-type GaN layer of the p-type cladding region. FIG. 9 is a drawing showing characteristics of Group III nitride semiconductor lasers fabricated in Example 4. Part (a) of FIG. 9 shows dependence of threshold current Ith on thickness ratio d2/(d1+d2). It is seen from part (a) of FIG. 9 that the threshold current Ith increases with increase in thickness ratio. A conceivable reason for it is that the optical confinement degrades with increase in thickness ratio and that absorption loss increases with increase in the ratio of the p-type GaN layer of the higher Mg concentration. When the thickness ratio is kept not more than 0.6, an increase rate of the threshold current Ith to that at the thickness ratio of zero can be controlled to not more than 10%. Part (b) of FIG. 9 shows dependence of drive voltage Vf (at the drive current of 600 mA) on the thickness ratio d2/(d1+d2). It is seen from part (b) of FIG. 9 that Vf decreases with increase in thickness ratio. This effect appears even with and a prominent Vf reduction effect is achieved as long as the thickness ratio is not less than 0.2. This is conceivably because there is an effect of combining the p-type GaN layer for injection of holes with the p-type InAlGaN layer having the small effective mass.

As described above, the embodiment of the present invention provides the nitride semiconductor laser enabling the reduction of drive voltage while reducing the degradation of optical confinement. Furthermore, the embodiment of the present invention provides the epitaxial substrate for this nitride semiconductor laser.

Having illustrated and described the principle of the present invention in the preferred embodiments, but it should be noted that it is understood by those skilled in the art that the present invention can be modified in arrangement and detail without departing from the principle of the invention. Therefore, the applicant claims all corrections and modifications resulting from the scope of claims and the scope of spirit thereof.

What is claimed is:

1. A nitride semiconductor laser comprising:
an electrically conductive support substrate with a primary surface, the primary surface comprising a gallium nitride based semiconductor;
an active layer provided on the primary surface; and
a p-type cladding region provided on the primary surface, the primary surface being inclined relative to a reference plane perpendicular to a reference axis, the reference axis extending in a direction of a c-axis of the gallium nitride based semiconductor, the active layer being provided between the support substrate and the p-type cladding region,
the p-type cladding region including a first p-type Group III nitride semiconductor layer and a second p-type Group III nitride semiconductor layer,
the first p-type Group III nitride semiconductor layer comprising an InAlGaN layer,
the second p-type Group III nitride semiconductor layer comprising a semiconductor different from a material of the InAlGaN layer,
the InAlGaN layer including built-in anisotropic strain,
the first p-type Group III nitride semiconductor layer being provided between the second p-type Group III nitride semiconductor layer and the active layer, and
a resistivity of the second p-type Group III nitride semiconductor layer being lower than a resistivity of the first p-type Group III nitride semiconductor layer.

2. The nitride semiconductor laser according to claim 1, wherein a bandgap energy of the first p-type Group III nitride semiconductor layer is larger than a bandgap energy of the second p-type Group III nitride semiconductor layer.

3. The nitride semiconductor laser according to claim 1, wherein a bandgap of the first p-type Group III nitride semiconductor layer is not less than 3.47 eV and not more than 3.63 eV.

4. The nitride semiconductor laser according to claim 1, wherein the first and second p-type Group III nitride semiconductor layers are doped with magnesium (Mg), and
wherein a magnesium concentration of the first p-type Group III nitride semiconductor layer is smaller than a magnesium concentration of the second p-type Group III nitride semiconductor layer.

5. The nitride semiconductor laser according to claim 1, wherein a magnesium concentration of the first p-type Group III nitride semiconductor layer is not less than $8 \times 10^{17}$ cm$^{-3}$ and not more than $2 \times 10^{19}$ cm$^{-3}$.

6. The nitride semiconductor laser according to claim 1, wherein a thickness of the p-type cladding region is not less than 300 nm and not more than 1000 nm, and
wherein the first and second p-type Group III nitride semiconductor layers have respective thicknesses d1 and d2 and the thickness of the second p-type Group III nitride semiconductor layer satisfies the relation of $0.2 \leq d2/(d1+d2) \leq 0.6$.

7. The nitride semiconductor laser according to claim 1, wherein an angle between the primary surface of the support substrate and the reference axis is in a range of not less than 10 degrees and not more than 80 degrees or in a range of not less than 100 degrees and not more than 170 degrees.

8. The nitride semiconductor laser according to claim 1, wherein an angle between the primary surface of the support substrate and the reference axis is in a range of not less than 63 degrees and not more than 80 degrees or in a range of not less than 100 degrees and not more than 117 degrees.

9. The nitride semiconductor laser according to claim 1, further comprising:
a p-type contact region provided on the p-type cladding region; and
an electrode provided so as to make a junction with the p-type contact region,
wherein a thickness of the p-type contact region is less than 300 nm, and
wherein a bandgap energy of the p-type cladding region is not less than a bandgap energy of the p-type contact region.

10. The nitride semiconductor laser according to claim 1, further comprising:
a p-type contact region provided on the p-type cladding region; and
an electrode provided so as to make a junction with the p-type contact region,
wherein a p-type dopant concentration of the second p-type Group III nitride semiconductor layer is lower than a p-type dopant concentration of the p-type contact region.

11. The nitride semiconductor laser according to claim 1, wherein the second p-type Group III nitride semiconductor layer is either one of a strained InAlGaN layer and a strained AlGaN layer.

12. The nitride semiconductor laser according to claim 1, wherein the second p-type Group III nitride semiconductor layer comprises a GaN layer.

13. The nitride semiconductor laser according to claim 1, wherein the active layer is provided so as to emit light at a wavelength of not less than 480 nm and not more than 550 nm.

14. The nitride semiconductor laser according to claim 1, further comprising:
an n-side InGaN optical guiding layer provided between the active layer and the support substrate; and
a p-side InGaN optical guiding layer provided between the active layer and the p-type cladding region,
wherein a thickness of the n-side InGaN optical guiding layer is larger than a thickness of the p-side InGaN optical guiding layer.

15. The nitride semiconductor laser according to claim 1, further comprising:
an n-side InGaN optical guiding layer provided between the active layer and the support substrate; and
a p-side InGaN optical guiding layer provided between the active layer and the p-type cladding region,
wherein an indium composition of the n-side InGaN optical guiding layer is larger than an indium composition of the p-side InGaN optical guiding layer.

16. The nitride semiconductor laser according to claim 1, further comprising:
an n-side InGaN optical guiding layer provided between the active layer and the support substrate; and
a p-side InGaN optical guiding layer provided between the active layer and the p-type cladding region,
wherein an indium composition of the n-side InGaN optical guiding layer is not less than 0.04.

17. The nitride semiconductor laser according to claim 1, further comprising:
an n-side InGaN optical guiding layer provided between the active layer and the support substrate; and
a p-side InGaN optical guiding layer provided between the active layer and the p-type cladding region,
wherein a product of a thickness of the n-side InGaN optical guiding layer and an indium composition of the n-side InGaN optical guiding layer is larger than a product of a thickness of the p-side InGaN optical guiding layer and an indium composition of the p-side InGaN optical guiding layer, and
wherein the product of the thickness of the n-side InGaN optical guiding layer and the indium composition of the n-side InGaN optical guiding layer is not less than 2 and not more than 10, where the unit of the thickness of the n-side InGaN optical guiding layer is represented in nanometers, and the indium composition of the n-side InGaN optical guiding layer is represented in a molar ratio with respect to the Group III constituent element.

18. The nitride semiconductor laser according to claim 1, wherein the c-axis is inclined toward a crystal axis which is either one of an a-axis and an m-axis of the gallium nitride based semiconductor,
wherein the support substrate is a GaN substrate, and a lattice constant D1(GaN) of a c-axis of the GaN substrate has a component D1(GaN)p parallel to the primary surface of the support substrate and a component D1(GaN)n perpendicular to the primary surface of the support substrate,
wherein a lattice constant D1 (InAlGaN) of a c-axis of the InAlGaN layer has a component D1(InAlGaN)p parallel to the primary surface of the support substrate and a component D1 (InAlGaN)n perpendicular to the primary surface of the support substrate,
wherein a lattice mismatch degree R1$p$ in the InAlGaN layer is defined by (D1(InAlGaN)p−D1(GaN)p)/D1(GaN)p, and
wherein the lattice mismatch degree R1$p$ is not less than −0.15% and not more than +0.2%.

19. The nitride semiconductor laser according to claim 1, wherein the c-axis is inclined toward a crystal axis which is either one of an a-axis and an m-axis of the gallium nitride based semiconductor,
wherein the support substrate is a GaN substrate, and a lattice constant D2(GaN) of a crystal axis perpendicular to a c-axis of the GaN substrate has a component D2(GaN)p parallel to the primary surface of the support substrate and a component D2(GaN)n perpendicular to the primary surface of the support substrate,
wherein a lattice constant D2(InAlGaN) of a crystal axis perpendicular to the c-axis of the InAlGaN layer has a component D2(InAlGaN)p parallel to the primary surface of the support substrate and a component D2(InAlGaN)n perpendicular to the primary surface of the support substrate,
wherein a lattice mismatch degree R2$p$ in the InAlGaN layer is defined by (D2(InAlGaN)p−D2(GaN)p)/D2(GaN)p, and
wherein the lattice mismatch degree R2$p$ is not less than −0.15% and not more than +0.2%.

20. The nitride semiconductor laser according to claim 1, wherein the c-axis is inclined toward a crystal axis which is either one of an a-axis and an m-axis of the gallium nitride based semiconductor, wherein the support substrate is a GaN substrate,
wherein a lattice constant D1(GaN) of the c-axis of the GaN substrate has a component D1(GaN)p parallel to the primary surface of the support substrate and a component D1(GaN)n perpendicular to the primary surface of the support substrate,
wherein a lattice constant D1(InAlGaN) of the c-axis of the InAlGaN layer has a component D1(InAlGaN)p parallel to the primary surface of the support substrate and a component D1(InAlGaN)n perpendicular to the primary surface of the support substrate,
wherein a lattice mismatch degree R1$p$ in the InAlGaN layer is defined by (D1(InAlGaN)p−D1(GaN)p)/D1(GaN)p,
wherein the lattice mismatch degree R1$p$ is not less than −0.15% and not more than 0%,
wherein as to another of the a-axis and the m-axis, a lattice mismatch degree R2$p$ in the InAlGaN layer is defined by (D2(InAlGaN)p−D2(GaN)p)/D2(GaN)p,
wherein the lattice mismatch degree R2$p$ satisfies the condition of not less than 0% and not more than 0.2%,
wherein the component D2(InAlGaN)p is perpendicular to the component D1(InAlGaN)p, and
wherein the component D2(GaN)p is perpendicular to the component D1(GaN)p.

21. An epitaxial substrate for a nitride semiconductor laser, comprising:

a substrate with a primary surface, the primary surface comprising a gallium nitride based semiconductor;
an active layer provided on the primary surface; and
a p-type cladding region provided on the primary surface,
the primary surface being inclined relative to a reference plane perpendicular to a reference axis, the reference axis extending in a direction of a c-axis of the gallium nitride based semiconductor,
the active layer being provided between the substrate and the p-type cladding region,
the p-type cladding region including a first p-type Group III nitride semiconductor layer and a second p-type Group III nitride semiconductor layer,
the first p-type Group III nitride semiconductor layer comprising an InAlGaN layer,
the second p-type Group III nitride semiconductor layer comprising a semiconductor different from a material of the InAlGaN layer,
the InAlGaN layer including built-in anisotropic strain,
the first p-type Group III nitride semiconductor layer being provided between the second p-type Group III nitride semiconductor layer and the active layer, and
a resistivity of the second p-type Group III nitride semiconductor layer being lower than a resistivity of the first p-type Group III nitride semiconductor layer.

* * * * *